(12) United States Patent
Zhong

(10) Patent No.: US 10,008,391 B2
(45) Date of Patent: Jun. 26, 2018

(54) METHOD OF FORMING COPPER INTERCONNECTS

(71) Applicant: SHANGHAI IC R&D CENTER CO., LTD., Shanghai (CN)

(72) Inventor: Min Zhong, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days. days.

(21) Appl. No.: 14/759,928

(22) PCT Filed: Aug. 11, 2014

(86) PCT No.: PCT/CN2014/084098
§ 371 (c)(1),
(2) Date: Jul. 8, 2015

(87) PCT Pub. No.: WO2015/172442
PCT Pub. Date: Nov. 19, 2015

(65) Prior Publication Data
US 2016/0276169 A1    Sep. 22, 2016

(30) Foreign Application Priority Data
May 13, 2014    (CN) .......................... 2014 1 0200924

(51) Int. Cl.
*H01L 21/321* (2006.01)
*H01L 21/288* (2006.01)
*H01L 21/768* (2006.01)

(52) U.S. Cl.
CPC ...... *H01L 21/3212* (2013.01); *H01L 21/2885* (2013.01); *H01L 21/321* (2013.01); *H01L 21/7684* (2013.01); *H01L 21/76802* (2013.01); *H01L 21/76846* (2013.01); *H01L 21/76864* (2013.01); *H01L 21/76867* (2013.01); *H01L 21/76883* (2013.01)

(58) Field of Classification Search
CPC .................................................. H01L 21/3212
USPC .......................................................... 438/627
See application file for complete search history.

(56) References Cited

U.S. PATENT DOCUMENTS 6,037,258 A * 3/2000 Liu ..................... H01L 21/7684
257/E21.583
6,417,109 B1 * 7/2002 Jordan ............. H01L 21/30625
257/E21.23
(Continued)

FOREIGN PATENT DOCUMENTS

| CN | 1748302 A1 | 3/2006 |
|---|---|---|
| CN | 101645412 A1 | 2/2010 |
| CN | 101740378 A1 | 6/2010 |

*Primary Examiner* — Moazzam Hossain
(74) *Attorney, Agent, or Firm* — Tianchen LLC.

(57) ABSTRACT

A method of forming copper interconnects includes: depositing a dielectric layer on a silicon wafer substrate; forming vias and/or trenches in the dielectric layer; next, depositing a barrier layer and a copper seed layer sequentially from bottom to up on the dielectric layer; depositing a copper layer on the copper seed layer, and performing an annealing process; then performing a multi-step polishing process to remove bulk coppers and stopping at the barrier layer; performing a planarization process to remove the barrier layer on the surface of the dielectric layer, a portion of the dielectric layer, and a portion of the copper in the vias and/or trenches to form the copper interconnects in the dielectric layer.

10 Claims, 8 Drawing Sheets

(56) References Cited

U.S. PATENT DOCUMENTS

| | | | | |
|---|---|---|---|---|
| 6,420,258 B1* | 7/2002 | Chen | ............... | H01L 21/76879 |
| | | | | 257/E21.586 |
| 6,455,418 B1* | 9/2002 | Bhowmik | ......... | H01L 21/76843 |
| | | | | 257/E21.585 |
| 9,293,367 B2* | 3/2016 | Sulfridge | ............. | H01L 21/288 |
| | | | | 438/627 |
| 2002/0137344 A1* | 9/2002 | Jordan | ............. | H01L 21/30625 |
| | | | | 438/689 |
| 2005/0085066 A1* | 4/2005 | Tsao | .................. | H01L 21/288 |
| | | | | 438/633 |
| 2012/0070979 A1* | 3/2012 | Anderson | ............... | C25D 3/38 |
| | | | | 438/652 |
| 2013/0168779 A1* | 7/2013 | Chao | ............... | H01L 29/66477 |
| | | | | 257/402 |
| 2014/0367801 A1* | 12/2014 | Liu | ................. | H01L 29/42376 |
| | | | | 257/407 |

* cited by examiner

--Prior art--

--Prior art--

--Prior art--

--Prior art--

--Prior art--

--Prior art--

--Prior art--

METHOD OF FORMING COPPER INTERCONNECTS

CROSS-REFERENCE TO RELATED APPLICATION

This application claims the priority benefit of International Patent Application Serial No. PCT/CN2014/084098, filed Aug. 11, 2014, which is related to and claims the priority benefit of China patent application serial No. 201410200924.6, filed May 13, 2014. The entirety of each of the above-mentioned patent applications is hereby incorporated by reference herein and made a part of this specification.

FIELD OF THE INVENTION

The present invention generally relates to the field of semiconductor manufacturing technology, and more particularly, to a method of forming copper interconnects in the dielectric layer.

BACKGROUND OF THE INVENTION

Copper interconnect technology is a new semiconductor manufacturing process that the semiconductor integrated circuit interconnects are manufactured by using the copper material instead of the conventional aluminum interconnect material. Since the thickness of interconnect layer can be reduced by using the copper interconnects, therefore the distributed capacitance between the interconnect layers is decreased, which makes it possible to provide high frequency chips. However, with the wafer dimension increasing, the process technology node decreasing and the integration degree increasing, the device's reliability requirements are becoming more stringent, and the existing copper interconnect processes is challenged to meet higher requirements.

FIG. 1 is a flow chart for illustrating a prior art method of forming copper interconnects; as shown in FIG. 1, the prior art method of forming copper interconnects includes:

Step S11: depositing a low k dielectric layer on an upper surface of a silicon wafer substrate.

FIG. 2 is a sectional view of structure of the prior art semi-manufactured product after step S11; as shown in FIG. 2, a low k dielectric layer 102 is deposited on the silicon water substrate 101.

Step S12: forming vias or trenches in the dielectric layer by photolithography and etch processes.

FIG. 3 is a sectional view of structure of the prior art semi-manufactured product after step S12; as shown in FIG. 3, the vias or trenches 103 are formed in the dielectric layer 102 by the photolithography and etch processes, which are used to form copper interconnects in the subsequent processes.

Step S13: depositing a barrier layer and a copper seed layer by a physical vapor deposition process.

FIG. 4 is a sectional view of structure of the prior art semi-manufactured product after step S13; as shown in FIG. 4, the barrier layer 104 and the copper seed layer 105 are formed by the physical vapor deposition process.

Step S14: depositing a copper layer by an Electrochemical Copper Plating (ECP) process on the copper seed layer.

FIG. 5 is a sectional view of structure of the prior art semi-manufactured product after step S14; as shown in FIG. 5, the copper layer (unannealed) 106 is deposited by the process of the Electrochemical Copper Plating on the copper seed layer 105.

Step S15: forming the half-finished copper interconnects by an annealing process.

FIG. 6 is a sectional view of structure of the prior art semi-manufactured product after step S15; as shown in FIG. 6, the half-finished copper interconnects (annealed) 107 is formed by the process of the annealing.

Step S16: polishing the half-finished copper interconnects surface to be flush with the dielectric material surface by performing a chemical mechanical planarization process, so as to form a finished copper interconnects.

FIG. 7 is a sectional view of structure of the prior art semi-manufactured product after step S16; as shown in FIG. 7, the half-finished copper interconnects 107 surface is polished to be flush with the dielectric material layer 102 surface by using chemical mechanical planarization (CMP), so as to form the finished copper interconnects 108.

In the method of forming copper interconnects as shown in the FIG. 1, in the Electrochemical Copper Plating process of step S14, since the pattern densities and critical dimensions are different in each area on the same chip, the thickness of copper layer by the Electrochemical Copper Plating process is different, such as, in the area with small dimension and high density pattern, the thickness of the copper layer would be increase, which is over-plating. In the copper polishing process of the subsequent step S16, the polishing pressures in different areas are different due to the difference in surface topography of the half-finished copper interconnects before polishing; in addition, since the polishing rate of copper is much higher than those of the barrier layer and the dielectric layer by using high selective ratio polishing slurry, the difference in pattern densities on the chip will affect the quality of the polished surface, for example, there are erosions 109 are formed in the regions with large critical dimension or the regions with high pattern density, and the polishing residues 110 are also formed in some regions. Therefore, the occurrence of erosions 109 and the polishing residues 110 reduce the effective thickness of the copper in the copper interconnects and the reliability of devices. The polishing residues 110 includes copper residues, residual copper reactants (copper oxide, etc.) and organic residues. The polishing residues 110 inside of the erosion 109 are tightly adhered to the surface of the erosion 109, which cannot be removed even in the subsequent cleaning processes.

In order to effectively solve the defects of copper surface topography in the conventional copper interconnects, a Chinese patent application CN102856249A disclosed a method which depositing a thin film after the Electrochemical Copper Plating process, and then processing a thermal reflow, to eliminate the differences in thickness of copper due to the different pattern densities on the copper plated wafer. However, this approach has two drawbacks:

1) The high temperature of the thermal reflow will make low k dielectric material unstable, which will reduce the copper interconnect devices performance of sub-40 nm technology node;

2) The introduction of new materials in the copper interconnects brings risk to the stability of the process.

Additionally, another Chinese patent application CN102222638A disclosed a method including: depositing silicide after polishing the copper to be flush with the dielectric layer in the first step; next, performing a second polishing to solve the problem of copper residues. However, in this method, under the condition of high temperature and oxygen gas, the exposed copper on the surface is easy to be oxidized, which increases the resistivity of copper interconnects and decreases the performance of the device.

In summary, the prior art does not provide a method of forming copper interconnects, which could effectively eliminate the surface defects caused by the pattern densities in the processes of copper plating and/or copper polishing, such as erosions, polishing residues, and improve the effective thickness of the copper and device performance.

BRIEF SUMMARY OF THE DISCLOSURE

Accordingly, an objective of the present invention is to provide a method of forming copper interconnects, which can effectively eliminate the surface defects such as erosions and polishing residues caused by the pattern densities in the copper electroplating process and/or the copper polishing process, and improve the effective thickness of copper interconnects and performance of the device.

The method of forming copper interconnects according to the present invention includes: depositing a dielectric layer on a silicon wafer substrate; forming vias and/or trenches in the dielectric layer; depositing a barrier layer and a copper seed layer sequentially from bottom to top on the dielectric layer; depositing a copper layer on the copper seed layer, and performing an annealing process; then performing a multi-step polishing process to remove bulk coppers and stopping at the barrier layer; performing a planarization process to remove the barrier layer on the surface of the dielectric layer, a portion of the dielectric layer, and a portion of the copper in the vias and/or trenches to form the copper interconnects in the dielectric layer. Wherein the multi-step polishing process includes a first polishing process and a second polishing process; firstly, polishing the half-finished copper interconnects (the copper layer) by the first polishing process, to remove the bulk coppers on the surface of the barrier layer; next, performing the second polishing process to remove the polishing residues on the top of the copper in the vias and/or the trenches which are generated during the first polishing process.

Preferably, while the bulk coppers above the barrier layer have been moved, the residue forms on erosions; the removing the residue on the surface of the copper layer filled in the vias and/or trenches by the second polishing process includes removing the residue on the erosions.

Preferably, the step that performing a multi-step polishing process to the copper interconnects and stopping at the barrier layer, includes: in the first polishing process, performing a rapid polishing process according to an end-point detection method to the copper interconnects using a polishing slurry with high selectivity ratio, so as to remove the bulk coppers on the barrier layer surface; next, reducing pressure and increasing rotational speed, performing the second polishing process to remove the polishing residues on the top of the copper in the vias and/or the trenches, and this polishing process is stopped at the barrier layer by using the end-point detection method and the low pressure monitoring process.

Preferably, in the process of polishing to remove the polishing residues at the top of the copper in the vias and/or trenches, wherein the polishing slurry used is an acidic solution, and a polishing platen and a polishing head are used; the step of increasing rotational speed is to increase the rotational speed of the polishing platen and the polishing head; the rotational speed of the polishing platen is in the range of 90 to 130 RPM, the rotational speed of the polishing head is in the range of 80 to 120 RPM, and the pressure for polishing is in the range of 0.8 to 1.5 psi.

Preferably, in the process of rapidly polishing to the copper interconnects to remove the bulk coppers on the surface of the barrier layer, a polishing platen and a hard polishing pad are used; however, in the process of polishing to remove the polishing residues on the top of the copper in the vias and/or the trenches, another polishing platen and a soft polishing pad are used.

Preferably, the process before the formation of the copper interconnects, and after the removal of the bulk coppers above the barrier layer, includes: forming a copper repair layer by depositing copper on the surface of the copper in the vias and/or trenches and then performing an anneal process.

Preferably, in the process of planarization to remove the barrier layer on the surface of the dielectric layer, a portion of the dielectric layer, and a portion of the copper in the vias and/or trenches to form copper interconnects also includes removing a portion of the copper repair layer.

Preferably, in the process of forming a copper repair layer by depositing copper on the surface of the copper in the vias and/or trenches and then performing an anneal process to form a copper repair layer, an atmosphere of $H_2$, $N_2$ or mixtures thereof is used, the temperature range is from 100 to 150° C., and the time range is from 60 to 400 seconds.

Preferably, in the process of planarization to remove the barrier layer on the surface of the dielectric layer, a portion of the dielectric layer, and a portion of the copper in the vias and/or trenches, a soft polishing pad and a polishing slurry with low selectivity ratio are used.

Preferably, in the process of depositing copper material on the barrier layer and in the vias and/or the trenches then annealing the copper to form a copper interconnects, an environment of $H_2$, $N_2$ or mixtures thereof is used, the temperature range is from 100 to 200° C., and the time range is from 30 to 200 seconds.

The present invention effectively reduce the defects such as erosions and polishing residues in the polishing process, the reduction in effective thickness of the copper interconnects are minimized or avoided, the uniformity of the device resistivity, device yield rate and performance are improved.

DETAILED DESCRIPTION OF THE EMBODIMENTS

The embodiments of the present invention will now be descried more fully hereinafter with reference to the accompanying drawings. These embodiments are provided so that this disclosure will be thorough and complete, and will fully convey the scope of the invention to those skilled in the art.

A core idea of the present invention includes: depositing a dielectric layer on the upper surface of a silicon wafer substrate; forming vias and/or trenches in the dielectric layer; depositing a barrier layer and a copper seed layer sequentially from bottom to top on the upper surface of the dielectric layer; depositing a copper layer on the copper seed layer, and performing an annealing process; then performing a multi-step polishing process to remove bulk coppers and stopping at the barrier layer; performing a planarization process to remove the barrier layer on the surface of the dielectric layer, a portion of the dielectric layer, and a portion of the copper in the vias and/or trenches to form the copper interconnects in the dielectric layer. Wherein the multi-step polishing process includes a first polishing process and a second polishing process; firstly, polishing copper interconnects by the first polishing process, to remove the bulk coppers on the surface of the barrier layer, next, performing the second polishing process to remove the polishing residues on the top of the copper in the vias and/or the trenches which are generated during the first polishing process.

In the following embodiments, the above mentioned core idea of the present invention will be described briefly hereafter with exemplary embodiments, the formation method of 40 nm copper interconnects on a 12-inch wafer is used as example. It is noted that, parameters used for other technology nodes maybe different than the parameters described in the following embodiments.

Figure 1:
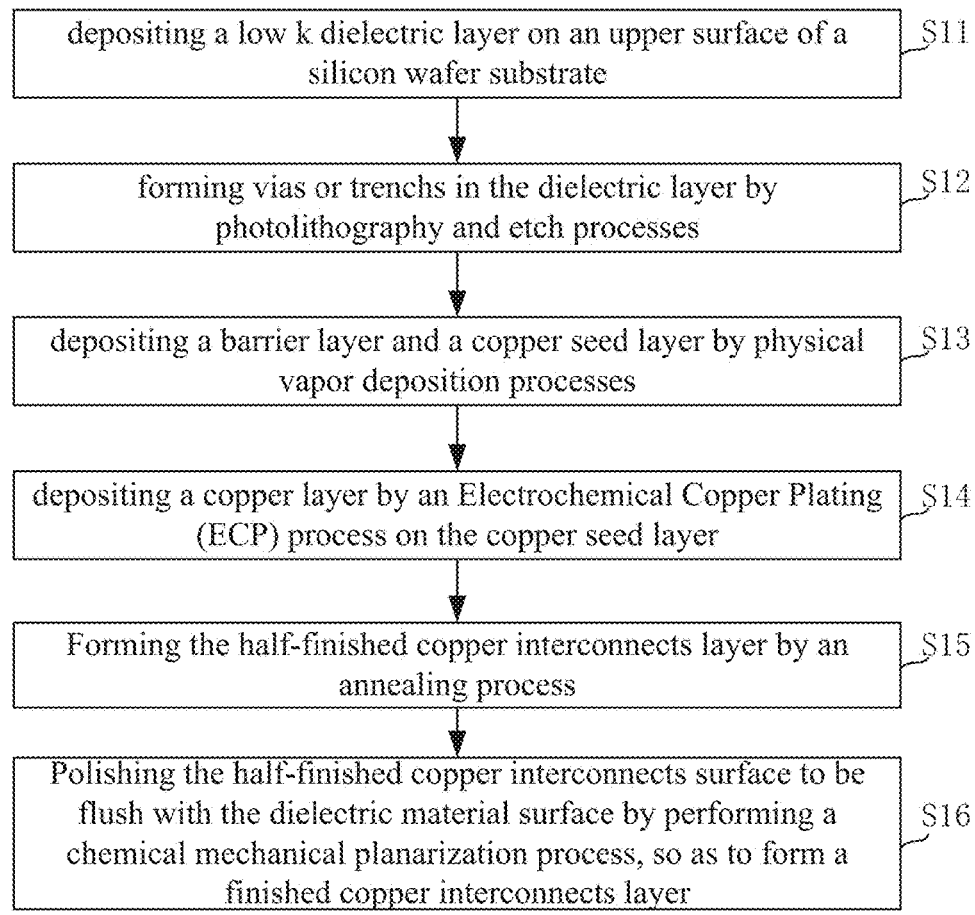
FIG. 1 is a flow chart for illustrating a prior art method of forming copper interconnects
Figure 2:
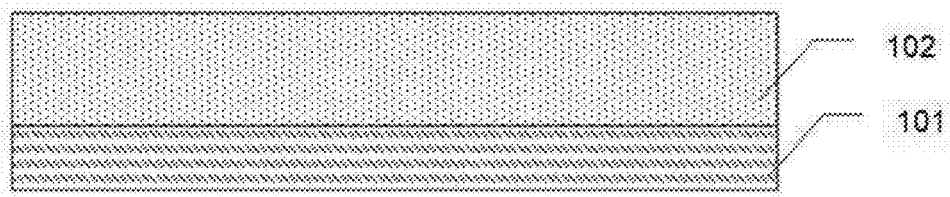
FIG. 2 is a sectional view of structure of the prior art semi-manufactured product after step S11
Figure 3:
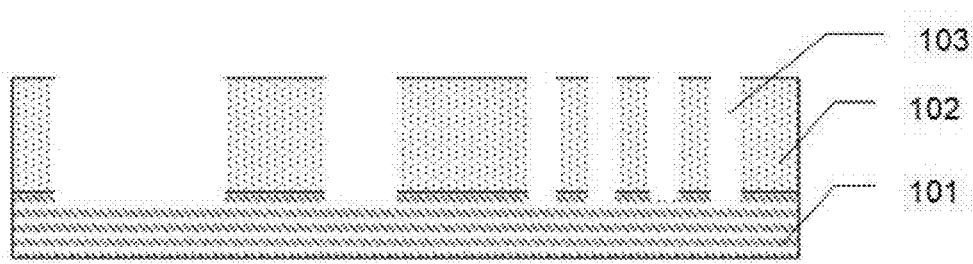
FIG. 3 is a sectional view of structure of the prior art semi-manufactured product after step S12
Figure 4:
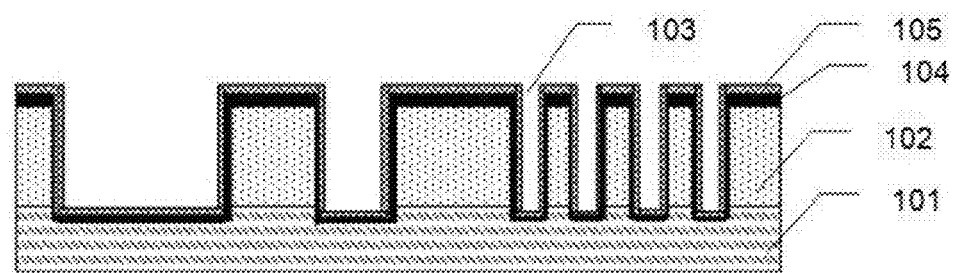
FIG. 4 is a sectional view of structure of the prior art semi-manufactured product after step S13
Figure 5:
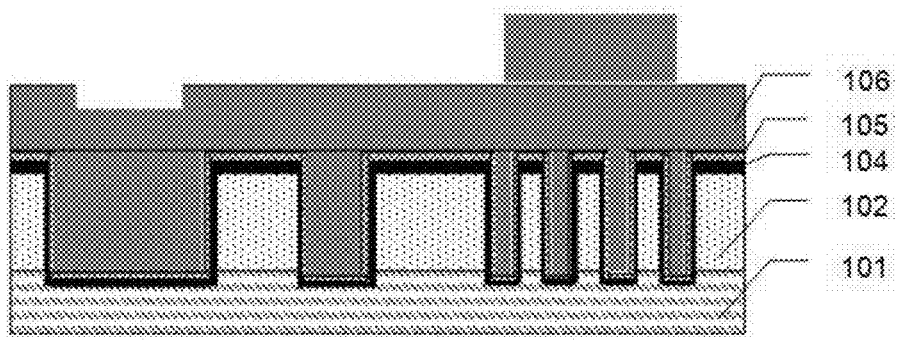
FIG. 5 is a sectional view of structure of the prior art semi-manufactured product after step S14
Figure 6:
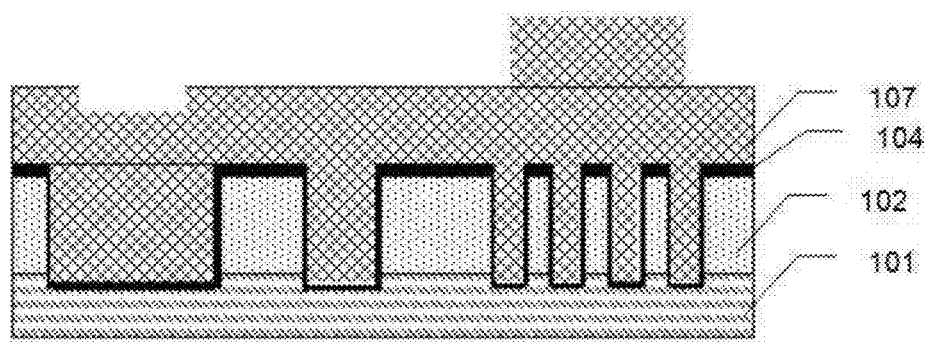
FIG. 6 is a sectional view of structure of the prior art semi-manufactured product after step S15
Figure 7:
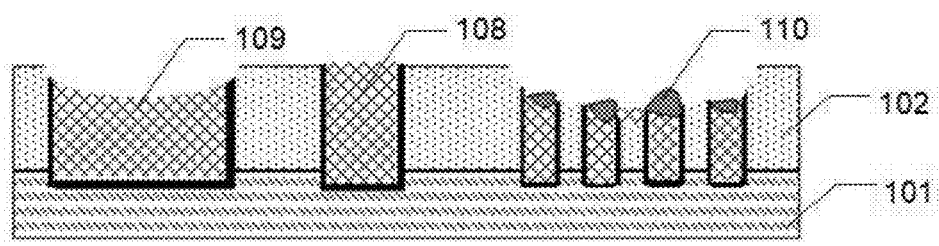
FIG. 7 is a sectional view of structure of the prior art semi-manufactured product after step S16
Figure 8:
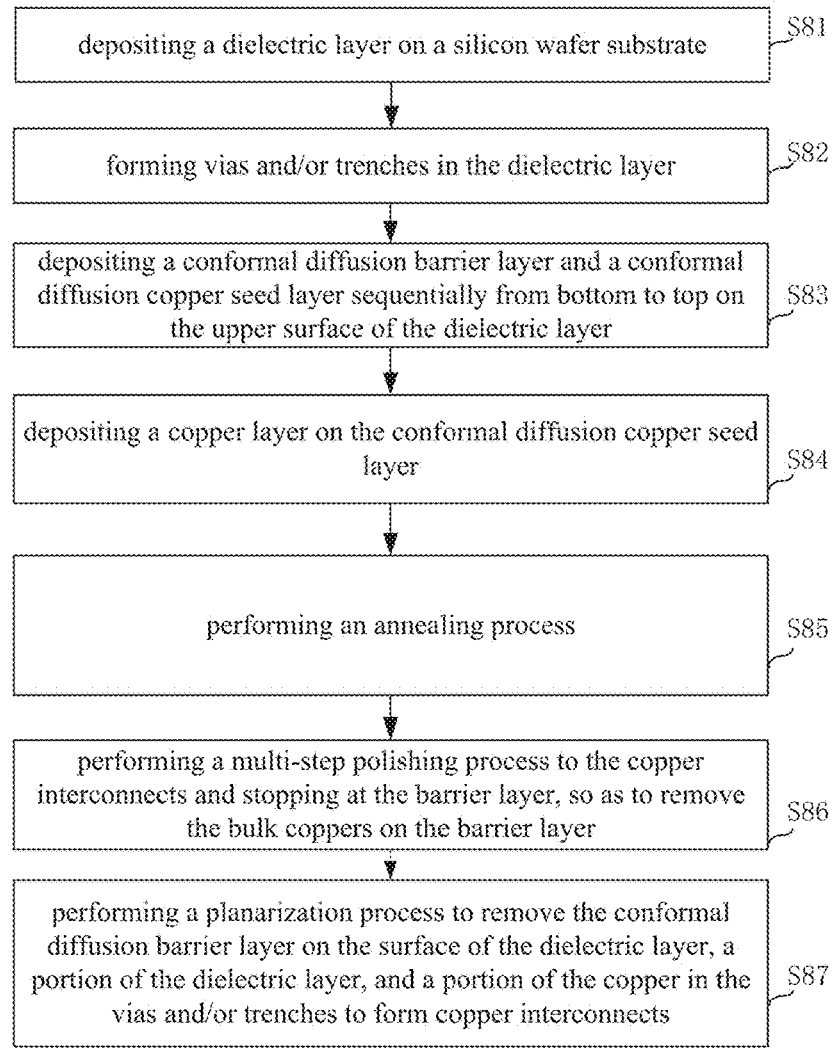
FIG. 8 is a flow chart illustrating a method of forming copper interconnects according to a first embodiment of the present invention

FIG. 8 is a flow chart illustrating a method of forming copper interconnects according to the first embodiment of the present invention; as shown in FIG. 8, the method of forming copper interconnects includes the following steps:

Step S81: depositing a dielectric layer on a silicon wafer substrate.

In the step S81 of the embodiment, a dielectric layer is formed by depositing a low k dielectric material; the low k dielectric material is Black Diamond series or SiLK series and the relative dielectric constant k value thereof is between 2.2 and 3.0. When Black Diamond series II is used as the dielectric material, the k value is between 2.5 and 2.6.

Figure 9:
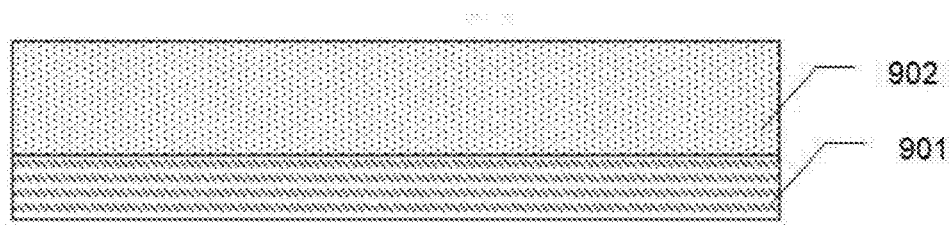
FIG. 9 is a sectional view of structure of the semi-manufactured product after step S81 according to an embodiment of the present invention

FIG. 9 is a sectional view of structure of the semi-manufactured product after step S81; as shown in FIG. 9, a dielectric layer 902 is deposited on a silicon wafer substrate 901.

Step S82: forming vias and/or trenches in the dielectric layer.

Figure 10:
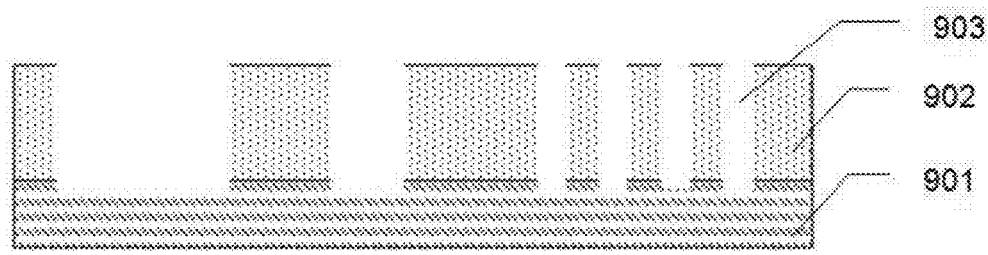
FIG. 10 is a sectional view of structure of the semi-manufactured product after step S82 according to an embodiment of the present invention

FIG. 10 is a sectional view of structure of the semi-manufactured product after step S82; as shown in FIG. 10, the vias and/or trenches 903 are formed based on the structure of FIG. 9, which are used for subsequent copper deposition to form copper interconnects in the dielectric layer 902.

Step S83: depositing a barrier layer and a copper seed layer sequentially from bottom to top on the upper surface of the dielectric layer.

In the embodiment, the barrier layer and the copper seed layer are deposited by a Physical Vapor Deposition (PVD) process. In this embodiment, the material of the barrier layer includes Ta and TaN, the thickness of Ta and TaN are 50 Å and 100 Å respectively; and the thickness of the copper seed layer is 100 Å; wherein Å is angstrom, 1 Å=$10^{-10}$ m.

Figure 11:
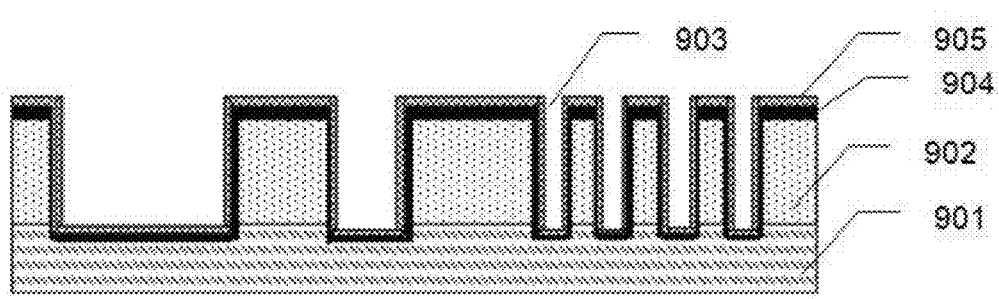
FIG. 11 is a sectional view of structure of the semi-manufactured product after step S83 according to an embodiment of the present invention

FIG. 11 is a sectional view of structure of the semi-manufactured product after step S83; as shown in FIG. 11, a barrier layer 904 and a copper seed layer 905 are formed based on the structure of FIG. 10.

Step S84: depositing a copper layer on the copper seed layer to form copper interconnects (unannealed). In the embodiment, the copper interconnects (unannealed) is formed by an Electrochemical Copper Plating (ECP) process.

Figure 12:
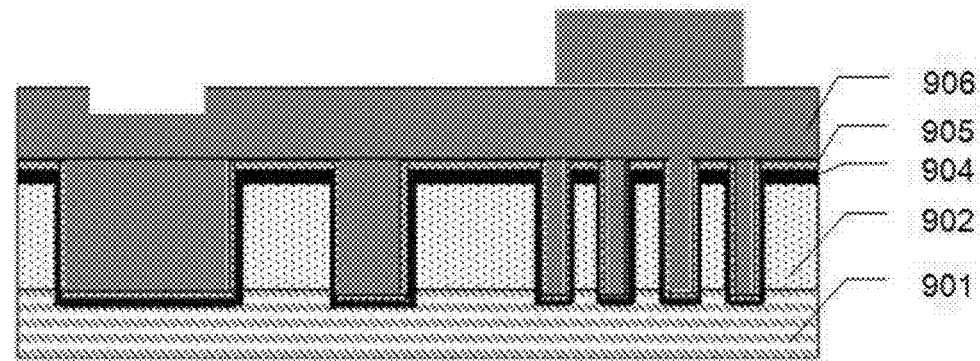
FIG. 12 is a sectional view of structure of the semi-manufactured product after step S84 according to an embodiment of the present invention

FIG. 12 is a sectional view of structure of the semi-manufactured product after step S84; as shown in FIG. 12, a copper interconnects (unannealed) 906 is formed based on the structure of FIG. 11.

The above mentioned steps S81 to S84 can be performed with reference to the corresponding steps in the conventional process, thus, no further detailed explanation is deemed necessary herein.

Step S85: performing an annealing process to form (annealed) copper interconnects.

In this embodiment, the annealing process can effectively evaporate additives in the ECP process and promote grain growth of copper, so as to reduce the resistivity of the copper interconnects. In addition, considering the property of the low k dielectric material BD II can easily be changed under high temperature, thus it is critical to control the annealing temperature. In this embodiment, the atmosphere is a mixture of $H_2$ and $N_2$, the temperature is 180° C., and the duration is 60 seconds is used for the annealing process.

Figure 13:
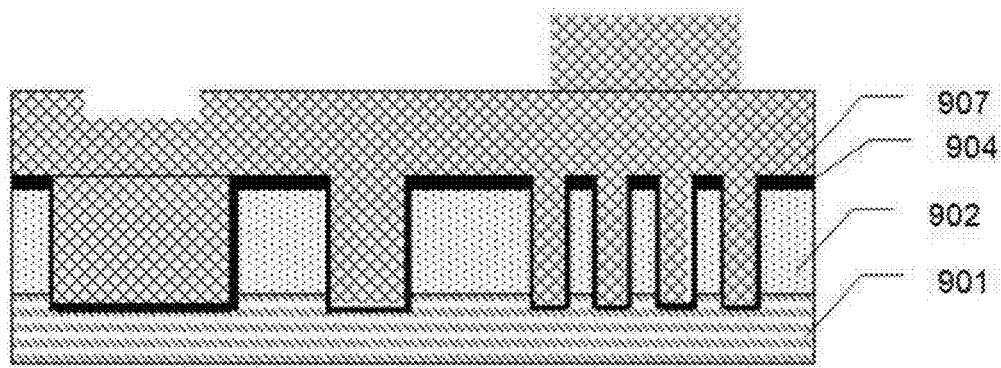
FIG. 13 is a sectional view of structure of the semi-manufactured product after step S85 according to an embodiment of the present invention

FIG. 13 is a sectional view of structure of the semi-manufactured product after step S85; as shown in FIG. 13, a copper interconnects (annealed) 907 is formed based on the structure of FIG. 12.

Step S86: performing a multi-step polishing process to the copper interconnects and stopping at the barrier layer, so as to remove the bulk coppers on the barrier layer.

In this embodiment, due to the fact that the copper surface is gradually oxidized with time, which will affect the polishing rate and the polishing quality, therefore, the polishing process have to be performed within 6 hours after the annealing process of step S85.

In this embodiment, the step S86 could include the following steps: a first polishing process and a second polishing process.

The first polishing process: polishing copper interconnects by the first polishing process, to remove the bulk coppers on the surface of the barrier layer. Specifically, the bulk coppers on the barrier layer surface can be rapidly removed according to the end point detection method by using a polishing platen, a polishing pad, and a high selective ratio polishing slurry; for example, firstly, polishing using a high selective ratio polishing slurry combined with high pressure and a hard polishing pad to accelerate the removal of the most bulk coppers; next, continuing the polishing process, however, with low pressure, using end-point detection method and high selective ratio polishing slurry until the barrier layer is reached; the removal of the bulk coppers also utilizes the conventional method of polishing the copper interconnects, which is not limited in the present invention.

Figure 14:
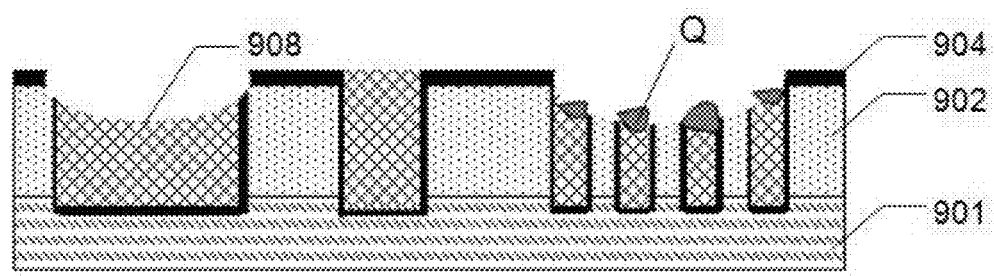
FIG. 14 is a sectional view of structure of the semi-manufactured product after the first polishing process according to an embodiment of the present invention

However, polishing the copper interconnects to remove the bulk coppers on the barrier layer surface, meanwhile, polishing residues are formed on the top of the copper in the vias and/or the trenches. Please refer to FIG. 14, which is a sectional view of structure of the semi-manufactured product after the first polishing process, wherein Q is the polishing residues. The differences in pattern densities on the wafer cause defects such as erosions and polishing residues on the top of the copper in the vias and/or the trenches during the polishing process. The polishing residues Q includes copper residues, residual copper reactant (copper oxide, etc.) and organic residues.

Next, performing the second polishing process to remove the polishing residues on the top of the copper in the vias and/or the trenches which are generated during the first polishing process.

Particularly, in this embodiment, the polishing residues on the top of the copper interconnects in the vias and/or the trenches are polished with reduced pressure and increased rotational speed and the polishing is stopped at the barrier layer using the end-point detection method and the low pressure monitoring process.

Herein, after the first polishing process, the polishing platen is replaced with another. The replaced polishing platen, a soft polishing pad, a high rotational speed, a low pressure and a high flux of the polishing slurry are used to perform the polishing process, so as to remove the polishing residues on the top of the coppers in the vias and/or the trenches, such as the copper residues, the copper oxide residues and the organic residues in erosions existing on the top of the coppers in the vias and/or the trenches.

In this embodiment, since the acidic solution can react with the polishing residues in at least one of the redox reaction, the dissolution reaction and the complexation reaction to produce soluble compounds; then the polishing residues can be removed by a high rotational speed, therefore, the acidic solution is used as the polishing slurry. The polishing slurry includes at least one organic acids, at least one surfactants and water. The organic acid includes at least one of the citric acid, the malic acid, the oxalic acid, the tartaric acid and the salicylic acid, and the weight percent of the organic acid content is in a range of 0.03~5 wt %. The surfactants are at least one of the anionic surfactants, the cationic surfactants and non-ionic surfactants. The PH value of the polishing slurry maybe below 7, such as weak acids.

In this embodiment, a polishing platen and a polishing head are used for polishing; the rotational speeds of the polishing platen and the polishing head can be increased to ensure the high overall rotational speed. The rotational speed of the polishing platen could be increased to 90-130 RPM, and the rotational speed of the polishing head could be increased to 80-120 RPM; in addition, the pressure could be decreased to 0.8-1.5 psi.

Preferably, while the bulk coppers above the barrier layer have been moved, the residue forms on the erosions; the removing the residue on the surface of the copper layer by the second polishing process includes removing the residue on the erosions.

Since the soft polishing pad is more deformable compare to a hard polishing pad, which has bigger contact area with the erosions, the polishing residues at the low-lying areas in the erosions can be removed by using the soft polishing pad and the polishing slurry together; the low pressure would not cause scratches on the surface of the erosions and the high rotational speed could make it easy to wipe out the polishing residues from the erosions.

In this embodiment, the end-point detection method could be used based on the current variations of the drive motor, or the acoustic emission signal, or the temperature variations of the polishing pad, or the optical spectral reflectance.

In this embodiment, the low pressure monitoring process could make a judgment based on the end-point curve; since this is known to those skilled in the art, thus no further detailed explanation is deemed necessary herein.

Figure 15:
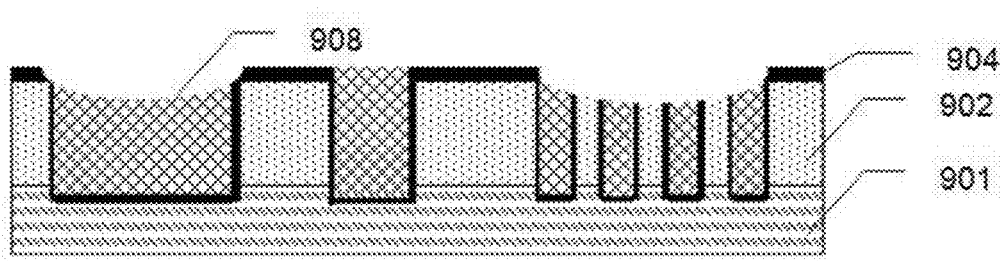
FIG. 15 is a sectional view of structure of the semi-manufactured product after step S86 according to an embodiment of the present invention

FIG. 15 is a sectional view of structure of the semi-manufactured product after step S86; as shown in FIG. 15, after the multi-step polishing to the structure of FIG. 13, the erosions 908 still exist, but no more copper residues. Compared with the conventional technology, the copper residues are avoided, which effectively prevents the interface problem of the copper interconnects, improves the uniformity of the copper interconnect resistances and the performance of the device.

Step S87: performing a planarization process to remove the barrier layer on the surface of the dielectric layer, a portion of the dielectric layer, and a portion of the copper in the vias and/or trenches to form copper interconnects.

Figure 16:
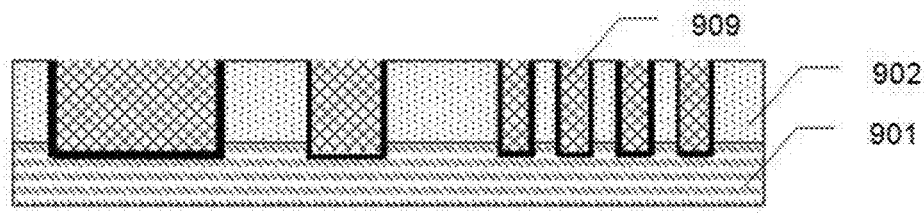
FIG. 16 is a sectional view of structure of the semi-manufactured product after step S87 according to an embodiment of the present invention

FIG. 16 is a sectional view of structure of the semi-manufactured product after step S87; as shown in FIG. 16, after performing the step S87 to the structure of FIG. 15, the copper interconnects 909 are formed in the vias and/or trenches.

In this embodiment, in the step S87, a soft polishing pad and a low selective ratio polishing slurry are used to perform the planarization process. After the planarization process, as shown in FIG. 16, both of the top surface of the remaining dielectric layer and the top surface of the copper in the vias and/or the trenches are flat. In the embodiment, the polishing pressure is between 1.0 and 2.0 psi, the polishing duration is between 30 and 120 seconds, and the loss of the low k dielectric material is below 400 Å. Preferably, the polishing pressure is 1.5 psi and the polishing duration is 90 seconds, so as to ensure that there is no copper material on the whole chip surface, and to form the copper interconnects 909. Since the copper and the low k dielectric material are soft, scratches on the chip surface during the polishing process can be avoided by using the soft polishing pad, and the influence of the pattern densities to the polishing process can be remarkably decreased and the defects such as corrosion will not occur by using low selective polishing slurry.

Figure 17:
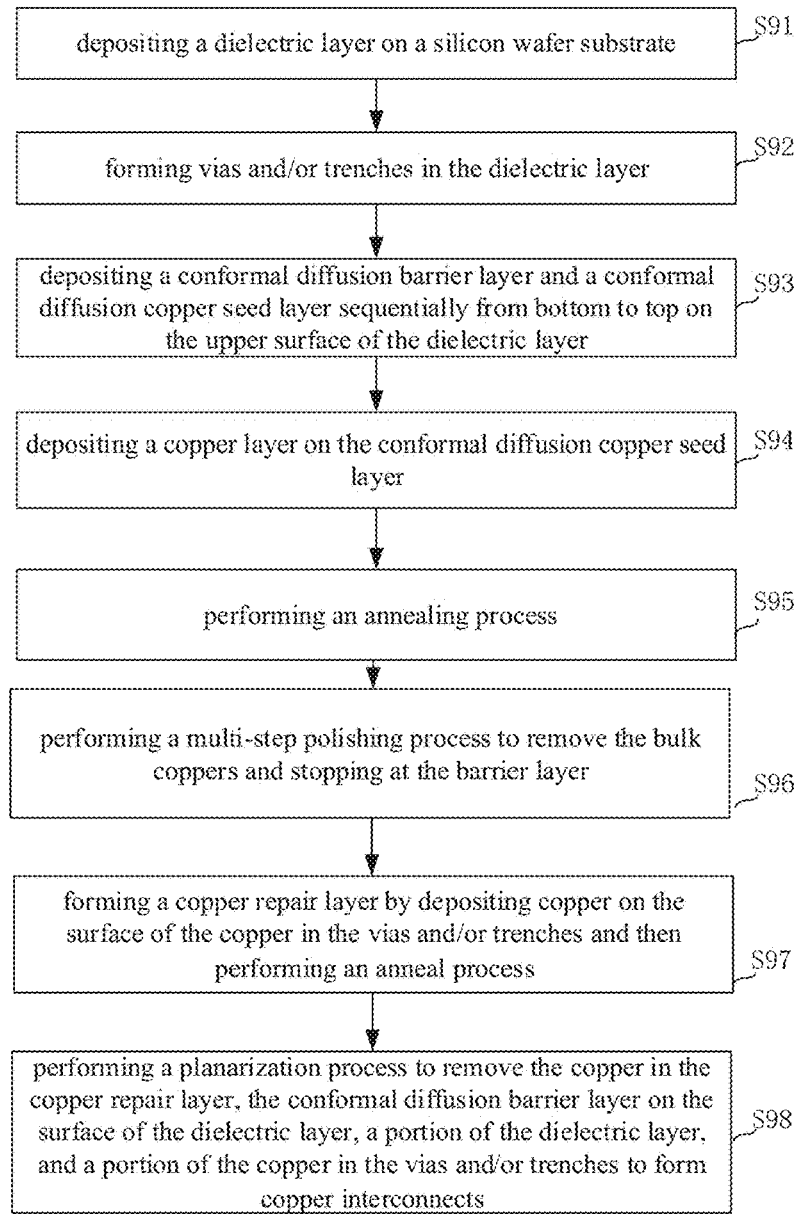
FIG. 17 is a flow chart illustrating the method of forming copper interconnects according to a second embodiment of the present invention

FIG. 17 is a flow chart illustrating the method of forming copper interconnects according to the second embodiment of the present invention; as shown in FIG. 17, the method of forming copper interconnects includes the following steps:

Step S91: depositing a dielectric layer on a silicon wafer substrate;

Step S92: forming vias and/or trenches in the dielectric layer;

Step S93: depositing a barrier layer and a copper seed layer sequentially from bottom to top on the upper surface of the dielectric layer;

Step S94: depositing a copper layer on the copper seed layer to form copper interconnects (unannealed);

Step S95: performing an annealing process;

Step S96: performing a multi-step polishing process to remove the bulk coppers and stopping at the barrier layer;

The details of steps S91 to S96 can be seen in the steps S81 to S86 of the first embodiment, no further detailed explanation is deemed necessary herein.

Step S97: forming a copper repair layer by depositing copper on the surface of the copper in the vias and/or trenches and then performing an anneal process.

In this embodiment, the copper repair layer could fill the aforementioned erosions, thereby the vias and/or the trenches are filled up with copper, which is beneficial to form flat top surfaces of the copper in the vias and/or trenches after the subsequent planarization process. The copper repair layer will be deposited on the barrier layer if it is very thick. For avoiding the occurrence of other defects resulted from a too long subsequent polishing time, the copper repair layer should not be too thick, such as 200 Å-1000 Å; the specific thickness is not limited herein.

In this embodiment, the copper repair layer is annealed with a low temperature, wherein the annealing temperature is 120° C. and the annealing duration is 200 seconds, so as to form the annealed copper repair layer. Herein the annealing process can make the grain of the physically-sputtered copper film grow up, so as to reduce the resistivity of the copper interconnects; in addition, the annealing process can combine well with the newly sputtered copper film with the aforementioned electroplated copper film, so as to avoid the occurrence of interface.

Figure 18:
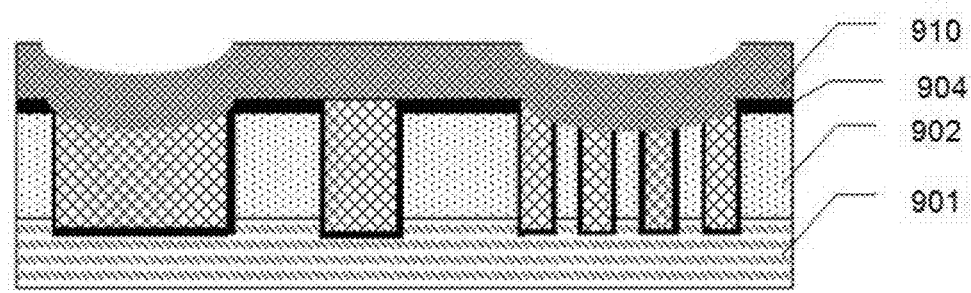
FIG. 18 is sectional view of structure of semi-manufactured product before performing the anneal process of step S97 to the repair layer according to the second embodiment of the present invention
Figure 19:
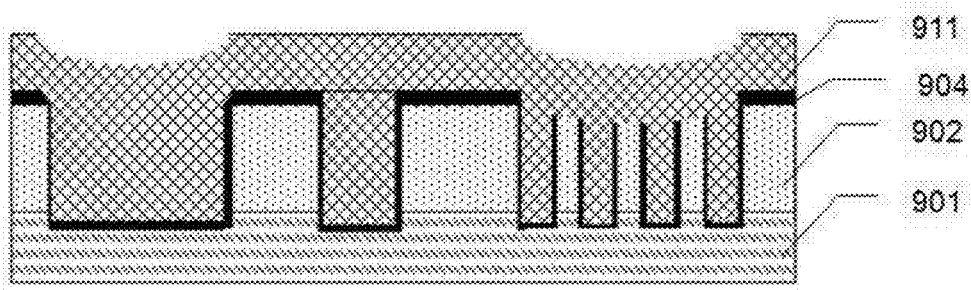
FIG. 19 is sectional view of structure of semi-manufactured product before performing the anneal process of step S97 to the repair layer according to the second embodiment of the present invention

FIGS. 18 and 19 are sectional views of structure of semi-manufactured product before and after performing the anneal process of step S97 to the copper repair layer respectively. As shown in FIGS. 18 and 19, the unannealed copper repair layer 910 and the annealed copper repair layer 911 are formed sequentially on the upper surfaces of the barrier layer 904 and the copper layer in the vias and/or trenches.

Step S98: performing a planarization process to remove the copper in the copper repair layer, the barrier layer on the surface of the dielectric layer, a portion of the dielectric layer, and a portion of the copper in the vias and/or trenches to form copper interconnects.

Specifically, in the planarization process, since the erosions are filled up by the copper repair layer, the top surface of the copper in the vias and/or trenches is flat; it is noted that, according to the difference in the depth of the erosions, the depth of the copper repair layer removal is also different, for example, in some embodiments, the entire copper repair layer is removed, however, in other embodiments, only a portion of the copper repair layer is removed. Since the detailed description of S98 can be seen in the relevant description of the step S87 in FIG. 8, no further detailed explanation is deemed necessary herein.

In the step S98, the copper residues can be minimized or avoided by combining the step S98 with the multi-step polishing process of the step S96, and the erosions can be minimized or avoided by combining the step S98 with the copper repair layer of the step S97, so as to improve the effective thickness of copper interconnects and the performance of the device.

While this invention has been particularly shown and described with references to preferred embodiments thereof. This invention may, however, be embodied in different forms and should not be construed as limited to the embodiments set forth herein. It will be understood by those skilled in the art that various changes in form and details may be made herein without departing from the spirit and scope of the invention as defined by the appended claims.

The invention claimed is:

1. A method of forming copper interconnects includes the following steps:
   depositing a dielectric layer on a silicon wafer substrate; then, forming vias and/or trenches in the dielectric layer; next, depositing a barrier layer and a copper seed layer sequentially from bottom to up on the dielectric layer;
   depositing a copper layer on the copper seed layer, and performing an annealing process; then performing a multi-step polishing process to remove bulk coppers and stopping at the barrier layer;
   performing a planarization process to remove the barrier layer on the surface of the dielectric layer, a portion of the dielectric layer, and a portion of the copper in the vias and/or trenches to form the copper interconnects in the dielectric layer;
   wherein the multi-step polishing process includes a first polishing process and a second polishing process; firstly, polishing the copper layer by the first polishing process using a hard polishing pad with a rotational speed under a high pressure, to remove the bulk coppers on the surface of the barrier layer; next, continuing to perform the second polishing process and stopping at the barrier layer to remove the polishing residues on the top of the copper in the vias and/or the trenches which are generated during the first polishing process; wherein a polishing pad used in the second polishing process is softer than a polishing pad used in the first polishing process, the polishing pad used in the second polishing process is rotated at a higher rotational speed and under a lower pressure than the polishing pad used in the first polishing process.

2. The method of forming copper interconnects according to claim 1, wherein while the bulk coppers above the barrier layer have been moved, the residue forms on erosions; the removing the residue on the surface of the copper layer filled in the vias and/or trenches by the second polishing process includes removing the residue on the erosions.

3. The method of forming copper interconnects according to claim 1, wherein the step that performing a multi-step polishing process to the copper interconnects and stopping at the barrier layer, includes: in the first polishing process, performing a rapid polishing process according to an end-point detection method to the copper interconnects using a polishing slurry with high selectivity ratio, so as to remove the bulk coppers on the barrier layer surface, next, reducing pressure and increasing rotational speed; performing the second polishing process to remove the polishing residues on the top of the copper in the vias and/or the trenches, and this polishing process is stopped at the barrier layer by using the end-point detection method and the low pressure monitoring process.

4. The method of forming copper interconnects according to claim 3, wherein in the process of polishing to remove the polishing residues at the top of the copper in the vias and/or trenches, wherein the polishing slurry used is an acidic solution, and a polishing platen and a polishing head are used; the step of increasing rotational speed is to increase the rotational speed of the polishing platen and the polishing head; the rotational speed of the polishing platen is in the range of 90 to 130 RPM, the rotational speed of the polishing head is in the range of 80 to 120 RPM, and the pressure for polishing is in the range of 0.8 to 1.5 psi.

5. The method of forming copper interconnects according to claim 3, wherein, in the process of rapidly polishing to the copper interconnects to remove the bulk coppers on the surface of the barrier layer, a polishing platen and a hard polishing pad are used; however, in the process of polishing to remove the polishing residues on the top of the copper in the vias and/or the trenches, another polishing platen and a soft polishing pad are used.

6. The method of forming copper interconnects according to claim 1, wherein the process before the formation of the copper interconnects, and after the removal of the bulk coppers above the barrier layer, includes: forming a copper repair layer by depositing copper on the surface of the copper in the vias and/or trenches and then performing an anneal process.

7. The method of forming copper interconnects according to claim 6, wherein, in the process of planarization to remove the barrier layer on the surface of the dielectric layer, a portion of the dielectric layer, and a portion of the copper in the vias and/or trenches to form copper interconnects, also includes removing a portion of copper repair layer or the entire copper repair layer.

8. The method of forming copper interconnects according to claim 6, wherein, in the process of forming a copper repair layer by depositing copper on the surface of the copper in the vias and/or trenches and then performing an anneal process to form a copper repair layer, an atmosphere of H2, N2 or mixtures thereof is used, the temperature range is from 100 to 150° C., and the time range is from 60 to 400 seconds.

9. The method of forming copper interconnects according to claim 1, wherein, in the process of planarization to remove the barrier layer on the surface of the dielectric layer, a portion of the dielectric layer, and a portion of the copper in the vias and/or trenches, a soft polishing pad and a polishing slurry with low selectivity ratio are used.

10. The method of forming copper interconnects according to claim 1, wherein, in the process of depositing copper material on the barrier layer and in the vias and/or the trenches then annealing the copper to form a copper interconnects, an environment of H2, N2 or mixtures thereof is used, the temperature range is from 100 to 200° C., and the time range is from 30 to 200 seconds.

* * * * *